US006974997B2

(12) United States Patent
Maekawa

(10) Patent No.: US 6,974,997 B2
(45) Date of Patent: Dec. 13, 2005

(54) HIGH-VOLTAGE MOS TRANSISTOR

(75) Inventor: Hisayuki Maekawa, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 231 days.

(21) Appl. No.: 10/212,167

(22) Filed: Aug. 6, 2002

(65) Prior Publication Data
US 2003/0057460 A1    Mar. 27, 2003

(30) Foreign Application Priority Data
Sep. 21, 2001    (JP)    ............... 2001-289505

(51) Int. Cl.[7] .................. H01L 29/76; H01L 29/94
(52) U.S. Cl. .............. 257/341; 257/344; 257/335; 257/336
(58) Field of Search ................. 257/341, 344, 257/335, 336

(56) References Cited

U.S. PATENT DOCUMENTS 5,034,791 A * 7/1991 Kameyama et al. ......... 257/332
6,084,283 A * 7/2000 Arai ........................... 257/500

* cited by examiner

Primary Examiner—Amir Zarabian
Assistant Examiner—Kiesha Rose
(74) Attorney, Agent, or Firm—Volentine Francos & Whitt, PLLC

(57) ABSTRACT

A high-voltage MOS transistor capable of lowering the maximum substrate current without sacrificing the driving capacity of the transistor itself, and ensuring an acceptable lifetime of hot carriers is provided. By providing an overlapping region in a boundary region between a gate electrode and a lightly doped n-type diffusion layer of a drain electrode, it becomes possible to increase by about 50% a dopant dose of the lightly doped n-type diffusion layer, having effects on the so-called transistor characteristic of the n-channel high-voltage MOS transistor described above. Furthermore, by setting an overlapping amount to not less than 0.5 $\mu$m, it becomes possible to create a stable region with maximum substrate current (Isub max.) at not larger than 5 $\mu$A/$\mu$m.

19 Claims, 8 Drawing Sheets

PROFILE AT X-X' SECTIONAL FACE

FIG. 9 (PRIOR ART)
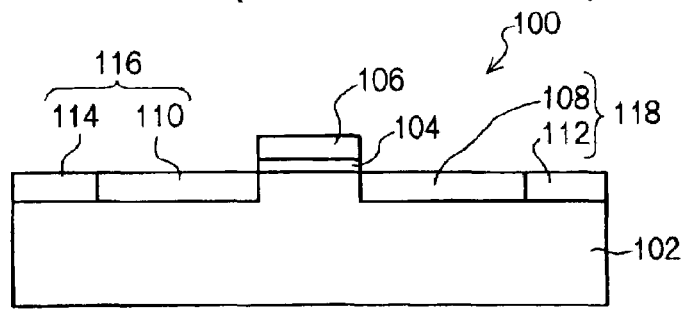
FIG. 10 (A) (PRIOR ART)
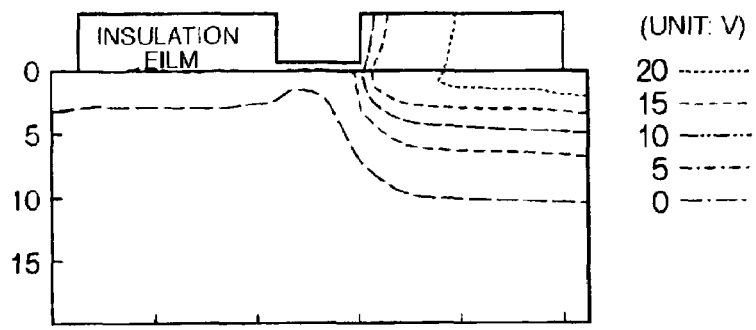
FIG. 10 (B) (PRIOR ART)
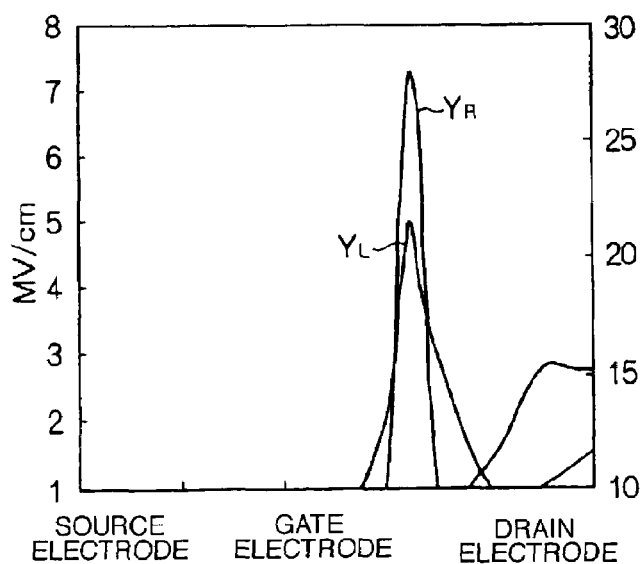

HIGH-VOLTAGE MOS TRANSISTOR

BACKGROUND OF THE INVENTION

1. Field of the Invention

The present invention relates to a high-voltage MOS transistor comprising a semiconductor substrate, a gate electrode disposed on the semiconductor substrate with an insulation film interposed therebetween, a pair of first diffusion layers formed on a surface layer side of the semiconductor substrate and disposed apart from each other by a predetermined distance under the gate electrode, and a pair of second diffusion layers, each adjacent to the side of the respective first diffusion layers, facing away from the gate electrode, and having a dopant dose higher than that for the first diffusion layers, wherein a source region is made up of one of the first diffusion layers, and one of the second diffusion layers adjacent to the one of the first diffusion layers and a drain region is made up of the other of the first diffusion layers, and the other of the second diffusion layers, adjacent to the other of the first diffusion layers.

2. Description of the Related Art

As shown in FIG. 9, a common n-channel high-voltage MOS transistor 100 is provided with a gate electrode 106 made of polysilicon, disposed on a p-type silicon semiconductor substrate 102 with a gate insulation film 104 made up of a gate oxide film, interposed therebetween.

Lightly doped n-type diffusion layers 108, 110 are formed by implanting phosphorus ions in the order of $6.0 \text{ E } 12 \text{ cm}^{-2}$ at 70 keV by the ion implantation method using the gate electrode 106 as a mask. Heavily doped n-type diffusion layers 112, 114 are formed by implanting arsenic ions in the order of $1.0 \text{ E } 15 \text{ cm}^{-2}$ at 40 keV into regions away from the gate electrode 106, and inside the lightly doped n-type diffusion layers 108, 110, respectively. These are generally called n-type regions, one of which can form a source electrode 116, and the other of which can form a drain electrode 118.

With the n-channel high-voltage MOS transistor 100 described above, when the gate electrode 106 and source electrode 116 are in grounded condition, and a voltage at 20V is applied to the drain electrode 118, potential distribution will be as shown in FIG. 10(A).

More specifically, it is shown that a potential density is at the highest in a region of the lightly doped n-type diffusion layer 108, on the side of the drain electrode 118, and directly underneath the gate electrode 106, that is, in a boundary region between the gate electrode 106 and the drain electrode 118.

Accordingly, as shown in FIG. 10(B), electric field strength in the region is at the maximum inside the n-channel high-voltage MOS transistor 100. If the electric field strength when the transistor is in operation exceeds 1E 5V/cm, this will cause impact ionization, so that electrons and holes, having high energy, are injected in and arrested by the gate insulation film 104 disposed directly above, thereby inducing time-dependent changes in transistor characteristics such as Vt, Gm, Ids, and so on. More specifically, when the transistor is in operation, an impact ionization ratio will reach the maximum in the boundary region between the gate electrode 106 and the drain electrode 118, and the transistor characteristics are prone to time-dependent changes.

Particularly, with a high-voltage MOS transistor, since an operation voltage thereof (voltage applied in a state where the transistor is actually mounted in a device) is high for one thing, a high electric field tends to be developed in the boundary region. Accordingly, it can be said that the high-voltage MOS transistor is in an environment prone to time-dependent changes in the characteristics thereof as described above.

The time-dependent change of the characteristics is defined by a hot carrier lifetime. The hot carrier lifetime generally refers to time for the characteristic undergoing a change by 10%.

Accordingly, the higher a ratio of a time-dependent change of the characteristics (the more intense a time-dependent change is), the shorter the lifetime of hot carriers. That is, it means that an actual service life of a transistor is short. In other words, suppression of impact ionization is important from the viewpoint of reliability of the transistor.

In this connection, current generated due to impact ionization can be observed as substrate current. That is, the substrate current is proportional to an impact ionization ratio.

FIG. 11 shows a gate voltage—substrate current characteristic in a state where 20V is applied to the drain electrode 118 and the source electrode 116 is grounded, demonstrating that substrate current has a peak value in relation to gate voltage. It can be said that the impact ionization ratio is at its maximum in a voltage condition where the substrate current is at the maximum. In FIG. 11, the substrate current is at the maximum when the gate voltage is in a range of 3 to 4V.

Further, FIG. 12 shows a characteristic diagram, obtained by plotting relationship between maximum substrate current (Isub max) and a hot carrier lifetime (Ids) with a dopant dose of the lightly doped n-type diffusion layer 108 as a parameter.

It is evident from FIG. 12 that there is a strong co-relationship between the maximum substrate current (Isub max) and the hot carrier lifetime (Ids). Accordingly, the Isub max will become a key factor in evaluation of the hot carrier lifetime and the impact ionization ratio.

In the past, a process design has been made on the basis of the key factor described above such that the maximum substrate current (Isub max) becomes sufficiently small in order to obtain a hot carrier lifetime with satisfactory reliability (for example, 10 years).

FIG. 12 shows that the maximum substrate current (Isub max) per unit gate length needs to be not larger than 5 $\mu\text{A}/\mu\text{m}$ in order to attain the hot carrier lifetime with the 10 year reliability.

Reduction in the maximum substrate current (Isub max) can be achieved by further lowering of dopant dose in the lightly doped n-type diffusion layer 108 as shown in FIG. 12, or by expansion of a gate length of the gate electrode 106, thereby rendering an electric field less intense.

With such methods as described, however, there has arisen a problem that the driving capacity of the transistor itself had to be inevitably sacrificed due to an increase in diffusion resistance of the source/drain, and channel resistance.

SUMMARY OF THE INVENTION

Taking into consideration the fact described above, it is an object of the invention to provide a high-voltage MOS transistor capable of lowering the maximum substrate current without sacrificing the driving capacity of the transistor itself, and ensuring an acceptable lifetime of hot carriers.

The high-voltage MOS transistor according to the invention comprises a semiconductor substrate, a gate electrode disposed on the semiconductor substrate with an insulation film interposed therebetween, a pair of first diffusion layers formed on a surface layer side of the semiconductor substrate and disposed apart from each other by a predetermined distance under the gate electrode, and a pair of second diffusion layers, each adjacent to the side of the respective first diffusion layers, facing away from the gate electrode, having a dopant dose higher than that for the first diffusion layers, wherein a source region is made up of one of the first diffusion layers, and one of the second diffusion layers, adjacent to the one of the first diffusion layers, while a drain region is made up of the other of the first diffusion layers, and the other of the second diffusion layers, adjacent to the other of the first diffusion layers, and at least the first diffusion layer of the drain region is disposed so as to be overlapped by the gate electrode by not less than approximately 0.5 $\mu$m such that the maximum substrate current per unit width in the semiconductor substrate is not larger than 5 $\mu A/\mu m$.

That is, the invention has been developed with an eye on a lifetime of hot carriers, thereby finding out an optimum overlapping width of the gate electrode on the first diffusion layer (lightly doped diffusion layer) in the drain region that ensures a sufficient lifetime of the hot carriers.

According to a first aspect of the invention, by overlaying the gate electrode on at least the first diffusion layer in the drain region (overlapping each other) in, a plan view, the peak value of an impact ionization as well as an electric field, in the boundary region between the gate electrode and the first diffusion layer, can be spread out within a range of such overlapping (an overlapping region), so that the peak values can be rendered lower accordingly.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

FIG. 9 is a sectional view broadly showing a conventional n-channel high-voltage MOS transistor;

FIG. 10 is a characteristic diagram showing reduction in an electric field strength and impact ionization ratio as a result of providing an overlapping region according to the conventional example;

DETAILED DESCRIPTION OF THE PREFERRED EMBODIMENTS

Figure 1:
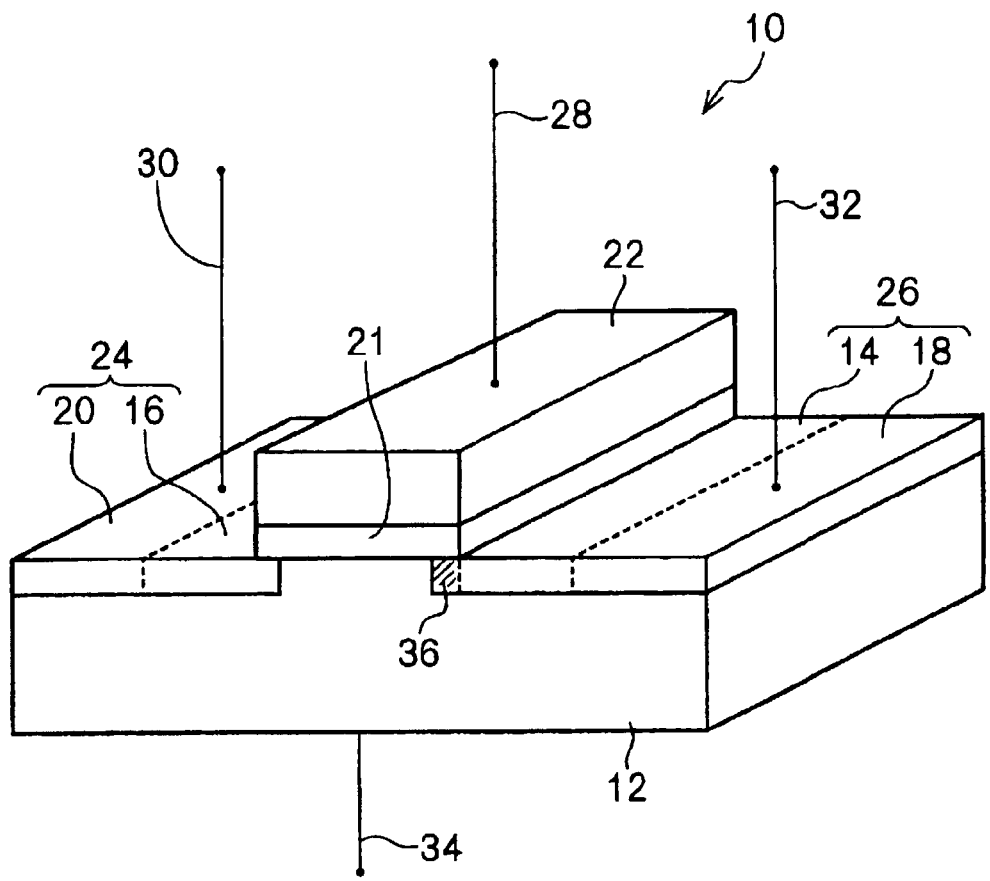
FIG. 1 is a perspective view broadly showing a first embodiment of a n-channel high-voltage MOS transistor according to the invention.
Figure 2:
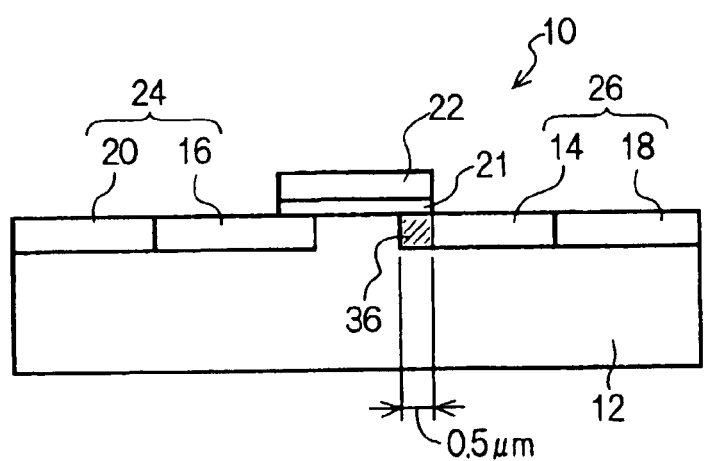
FIG. 2 is a sectional view broadly showing the first embodiment of the n-channel high-voltage MOS transistor according to the invention.

FIGS. 1 and 2 show a first embodiment of an n-channel high-voltage MOS transistor 10 according to the invention. The n-channel high-voltage MOS transistor 10 comprises a p-type silicon semiconductor substrate 12, a pair of symmetrical n-type regions (lightly doped n-type diffusion layers 14, 16, and heavily doped n-type diffusion layers 18, 20 to be described later), disposed in close proximity of a surface (upper surface) of the substrate 12, a gate insulation film 21 provided on the surface of the substrate 12, between the n-type regions, and a gate electrode 22 provided on top of the gate insulation film 21.

The gate electrode 22 on the p-type silicon semiconductor substrate 12 is made of polysilicon, and the gate insulation film 21 is made up of a gate oxide film.

With the present embodiment, the gate insulation film 21 is first formed, and subsequently, a mask for forming the lightly doped n-type diffusion layers 14, 16 as first diffusion layers is formed on the gate insulation film 21. Thereafter, using the mask, phosphorus ions in the order of 6.0 E 12 $cm^{-2}$ are implanted with energy at 70 keV, thereby forming the lightly doped n-type diffusion layers 14, 16 in the surface layer of the semiconductor substrate. After the formation of the lightly doped n-type diffusion layers 14, 16, the gate electrode 22 overlapping the lightly doped n-type diffusion layer 14 by a predetermined distance is formed by patterning, for example, a polysilicon layer formed on the gate insulation film 21. As a result, the n-type regions, particularly, the lightly doped n-type diffusion layers 14, 16 can be formed without depending on a gate electrode length.

Highly doped n-type diffusion layers 18, 20 are formed by implanting arsenic ions in the order of 1.0 E 15 $cm^{-2}$ at 40 keV in regions of the lightly doped n-type diffusion layers 14, 16, respectively, facing away from the gate electrode 22. The n-type regions on one side can form a source electrode 24, and those on the other side can form a drain electrode 26.

Extraction electrodes 28, 30, and 32 (refer to FIG. 1) have one end connected with the gate electrode 22, source electrode 24, and drain electrode 26, respectively, and a substrate electrode 34 has one end connected with the p-type silicon semiconductor substrate 12.

With the n-channel high-voltage MOS transistor 10 structured as described above, the gate electrode 22 and the lightly doped n-type diffusion layer 14 of the drain electrode 26 overlap each other in a plan view (diagonally shaded region in FIG. 2; referred to hereinafter as an overlapping region 36). In the case of the first embodiment, an amount of such overlapping is specified as 0.5 $\mu$m in length.

In this connection, a hot carrier lifetime is used as a factor for setting a length of the overlapping. The hot carrier lifetime of a common transistor is regarded ten years at present, and for setting the maximum substrate current per unit width of the semiconductor substrate so as to meet such requirement, it is desirable to set the maximum substrate current to not larger than 5 $\mu A/\mu m$.

With the invention, if the maximum substrate current at 5 $\mu A/\mu m$ is to be implemented, an optimum length over which the gate electrode 22 overlaps the lightly doped n-type diffusion layer 14 of the drain region is in the order of about 0.5 $\mu m$, and in case further reduction in the maximum substrate current is to be attempted, the length of the overlapping may be further expanded.

As described in the foregoing, with the present embodiment, by setting the amount of the overlapping between the lightly doped n-type diffusion layer 14 of the drain region, and the gate electrode 22 disposed thereon to not less than 0.5 $\mu m$, the maximum substrate current (Isub max) is enabled to be stable at not larger than 5 $\mu A/\mu m$.

Further, the overlapping amount of the lightly doped n-type diffusion layer 14 of the drain region is set to not less than 0.5 $\mu m$, and not greater than such an extent that a depletion layer of the lightly doped n-type diffusion layer 16 of the source region does not come to be in contact with that of the lightly doped n-type diffusion layer 14 of the drain region.

FIGS. 1 and 2 show a structure wherein the gate electrode 22 overlaps the lightly doped n-type diffusion layer 16 on the source electrode 24 side as well. However, with the present embodiment, if at least the lightly doped n-type diffusion layer 14 on the drain electrode 26 side is overlapped by the gate electrode 22 over not less than a predetermined distance, this will suffice. If the lightly doped n-type diffusion layer 16 of the source region is disposed at a position isolated from the lightly doped n-type diffusion layer 14 of the drain region to such an extent that the depletion layer of the former does not come to be in contact with the depletion layer of the latter, there is no need of the lightly doped n-type diffusion layer 16 of the source region and the gate electrode 22 overlapping each other.

With the first embodiment, the ion implantation method is used for adding dopants to form the lightly doped n-type diffusion layers 14, 16, and the heavily doped n-type diffusion layers 18, 20, respectively. This is because dopant doses can be controlled more accurately by the ion implantation methods as compared with the thermal diffusion method.

In the ion implantation method, conductive type dopants to be added are first ionized by electric discharge, accelerated in an electric field and thereafter, accurate ion species and charged species are selected by a mass spectrometer before implanted by beam radiation, thereby forming diffusion layers having predetermined doses of the dopants, respectively. Energy applied for the ion implantation at this point in time is in the order of about 70 keV. After the implantation, heat treatment is applied for forming a silicon oxide film which is the gate insulation film. With the present embodiment, it is desirable to apply the heat treatment at a temperature in the order of about 850° C. so as not to permit the lightly doped n-type diffusion layer 14 formed beforehand to be diffused in a lateral direction.

Figure 3A:
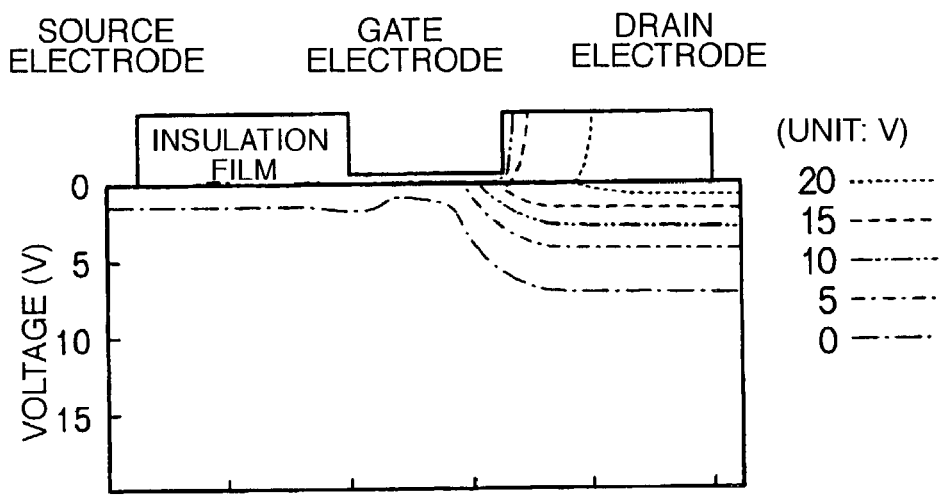
FIG. 3 is a characteristic diagram showing reduction in an electric field strength and impact ionization ratio as a result of providing an overlapping region according to the first embodiment.
Figure 3B:
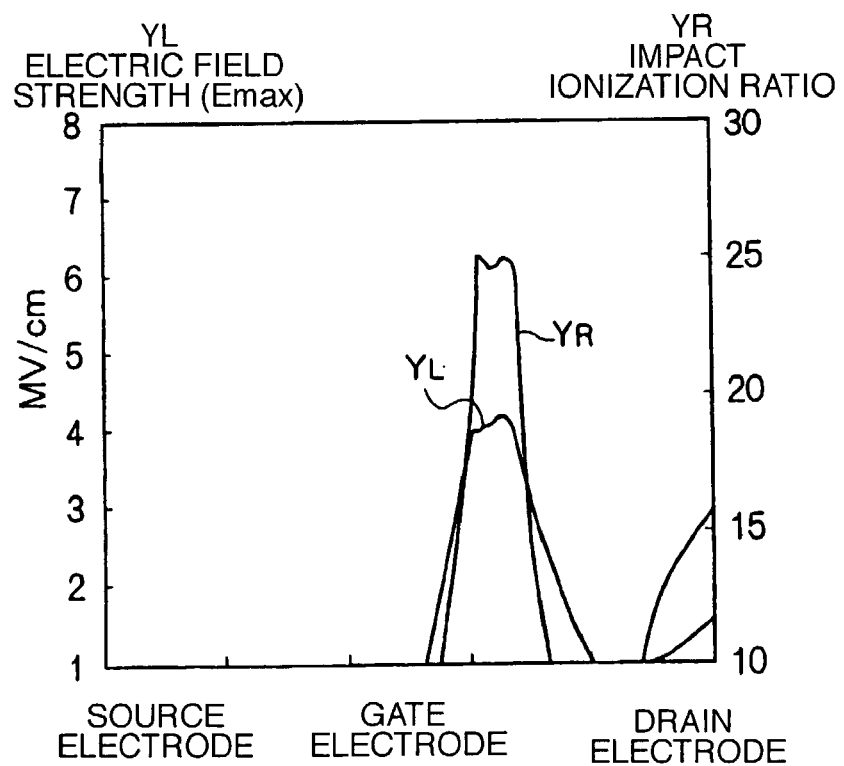

With the n-channel high-voltage MOS transistor 10, potential distribution at the boundary between the gate electrode 22 and the lightly doped n-type diffusion layer 14 of the drain electrode 26, that is, in the overlapping region 36, is shown spread out in a region where the overlapping takes place as shown in FIGS. 3(A) and (B), resulting in a lower potential density. As a result, as shown in FIG. 3(B), an electric field strength is reduced by about 1 E 5V/cm as compared with that in the case of the conventional technology refer to FIG. 10(B) and an electron density at impact ionization taking place when a transistor is energized is also reduced by about 10%.

Figure 4:
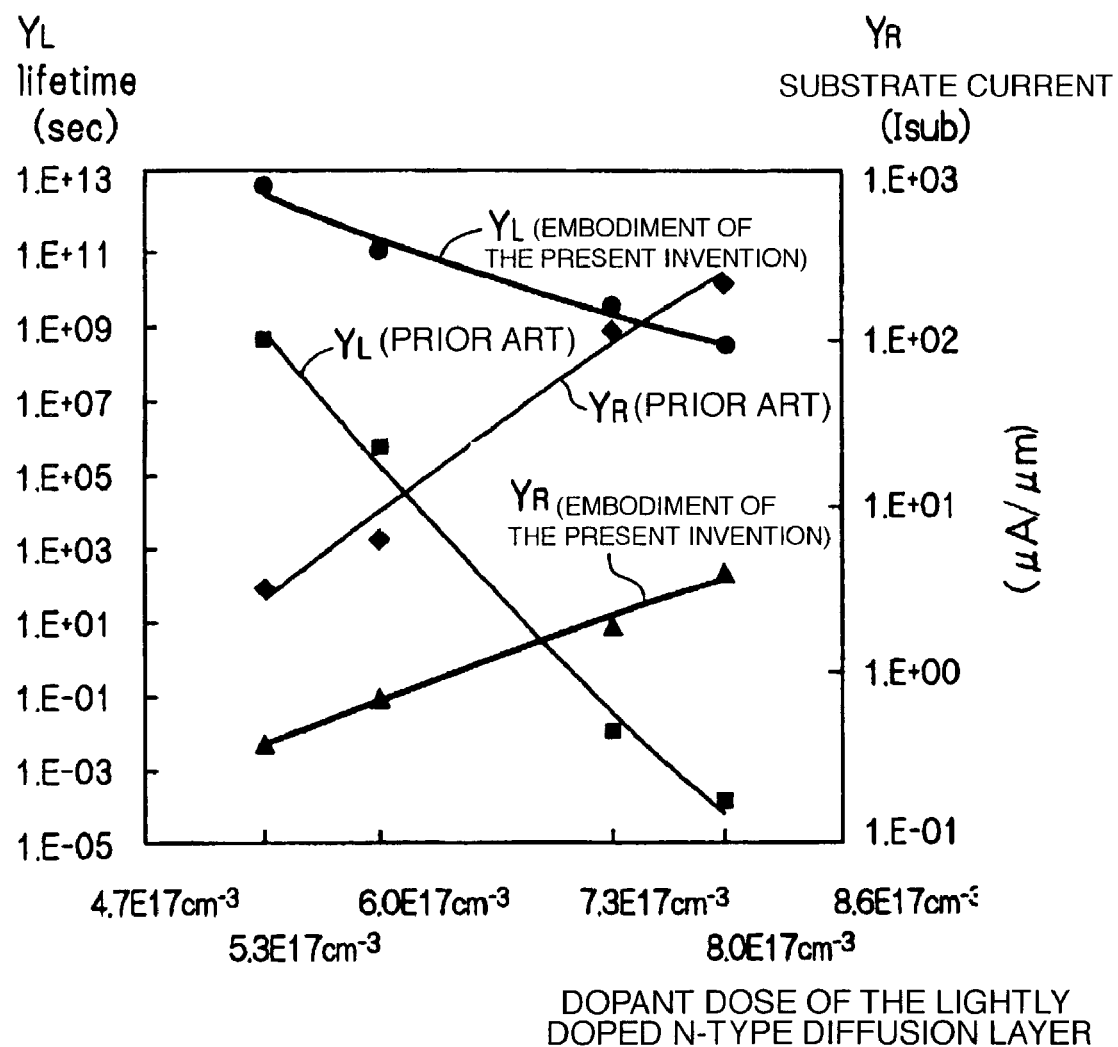
FIG. 4 is a characteristic diagram plotting co-relationship between hot carrier lifetime and maximum substrate current against dopant dose of a lightly doped n-type diffusion layer on the side of the drain according to the first embodiment.
Figure 11:
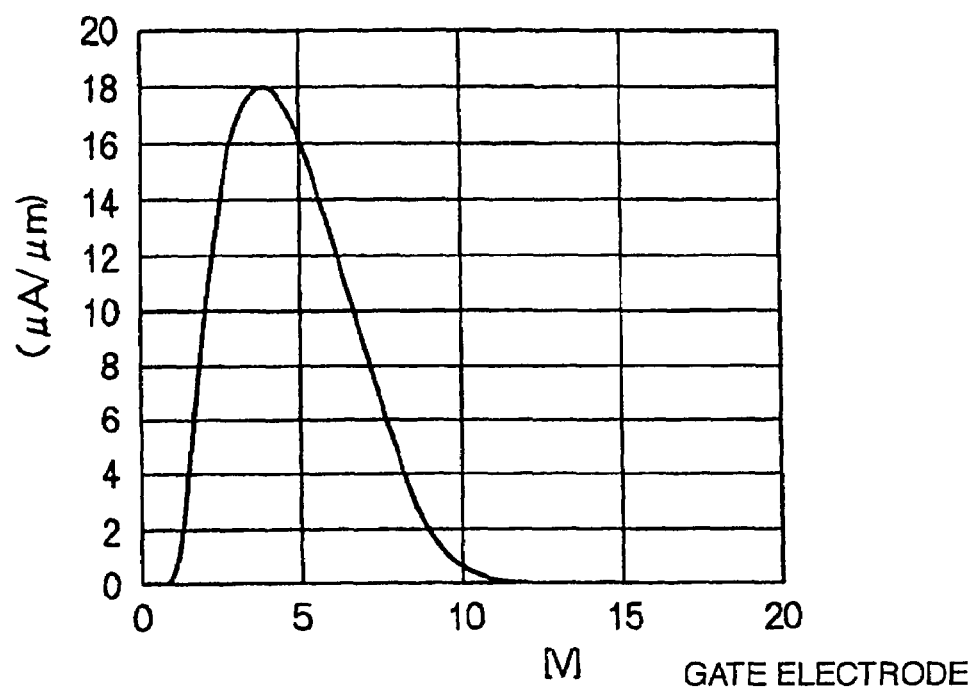
FIG. 11 is a gate voltage—substrate current plot.
Figure 12:
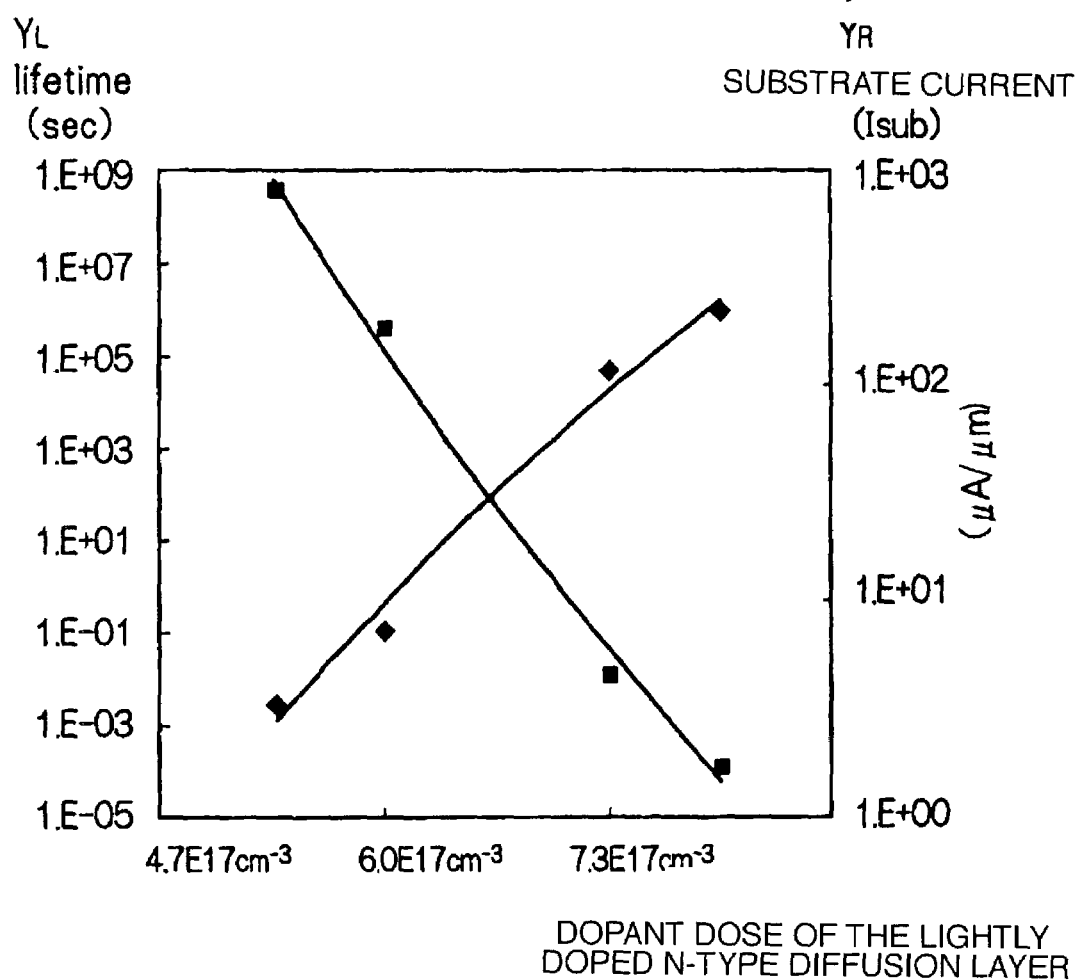
FIG. 12 is a characteristic diagram plotting co-relationship between hot carrier lifetime and maximum substrate current against dopant dose of a lightly doped n-type diffusion layer on the side of the drain according to the conventional example.

Now, FIG. 4 shows a characteristic diagram of the first embodiment, obtained by plotting relationship between the maximum substrate current (Isub max) and the hot carrier lifetime (Ids) with the lightly doped n-type diffusion layer 14 as a parameter, with reference to the maximum substrate current (Isub max) obtained from FIG. 11, taking advantage of the proportional relationship existing between the substrate current and the impact ionization ratio as described in connection with the conventional technology. In FIG. 4, the characteristics in the case of the conventional technology (refer to FIG. 12) are also shown by thin lines.

As shown in FIG. 4, with the first embodiment, under the condition that the maximum substrate current (Isub max) per unit gate length is at the upper limit (5 $\mu A/\mu m$) in order to attain sufficient reliability, that is, 10 year reliability, the dopant dose of the lightly doped n-type diffusion layer 14 can be increased to about 8.0 E 17 $cm^{-3}$ (an increase by about 50% over 5.3 E 17 $cm^{-3}$ for the conventional case). It means that the transistor according to the first embodiment has more superior characteristics.

Conversely, if the dopant dose of the lightly doped n-type diffusion layer 14 is kept at 5.3 E 17 $cm^{-3}$ as in the conventional case, the lifetime of the n-channel high-voltage MOS transistor 10 can be extended up to 1 E 13 sec (semipermanently).

Figure 5:
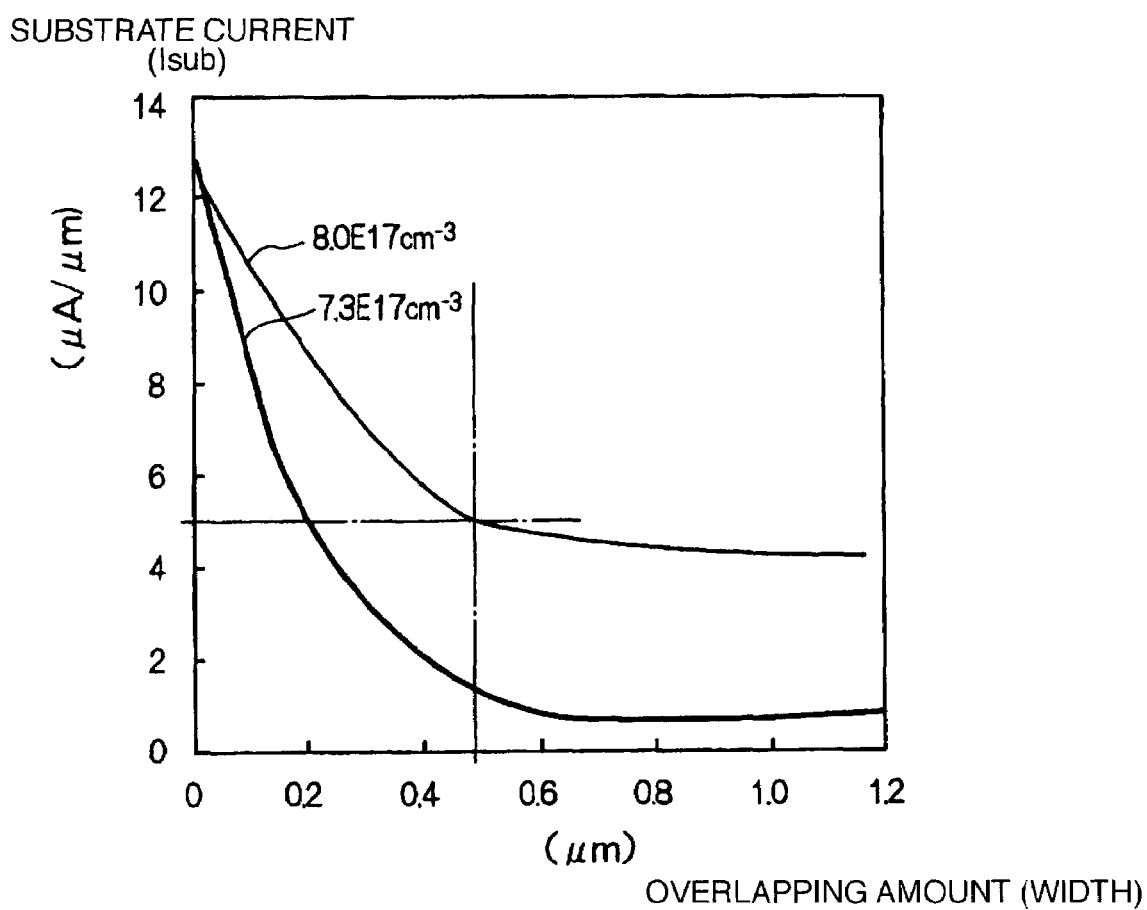
FIG. 5 is a plot of an overlapping amount of the overlapping region vs. substrate current according to the first embodiment.

Further, it is evident from a plot of the overlapping amount of the overlapping region 36 vs. substrate current (Isub) as shown in FIG. 5 that the substrate current (Isub) becomes substantially stable regardless of the dopant dose of the lightly doped n-type diffusion layer 14 by setting the overlapping amount to 0.5 $\mu m$ or more.

Thus, with the first embodiment of the invention, by providing the overlapping region 36 not less than 0.5 $\mu m$ in length in the boundary region between the gate electrode 22 and the lightly doped n-type diffusion layer 14 of the drain electrode 26, it becomes possible to increase by about 50% the dopant dose of the lightly doped n-type diffusion layer 14, having effects on the so-called transistor characteristic of the n-channel high-voltage MOS transistor 10 described above.

Furthermore, it is possible to stabilize the substrate current (Isub) at not larger than 5 $\mu A/\mu m$ by setting the overlapping amount to not less than 0.5 $\mu m$.

Figure 6:
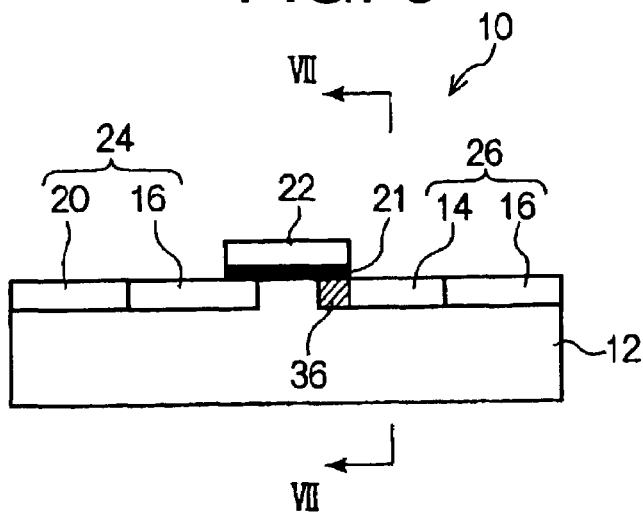
FIG. 6 is a sectional view broadly showing a second embodiment of a n-channel high-voltage MOS transistor according to the invention.
Figure 7:
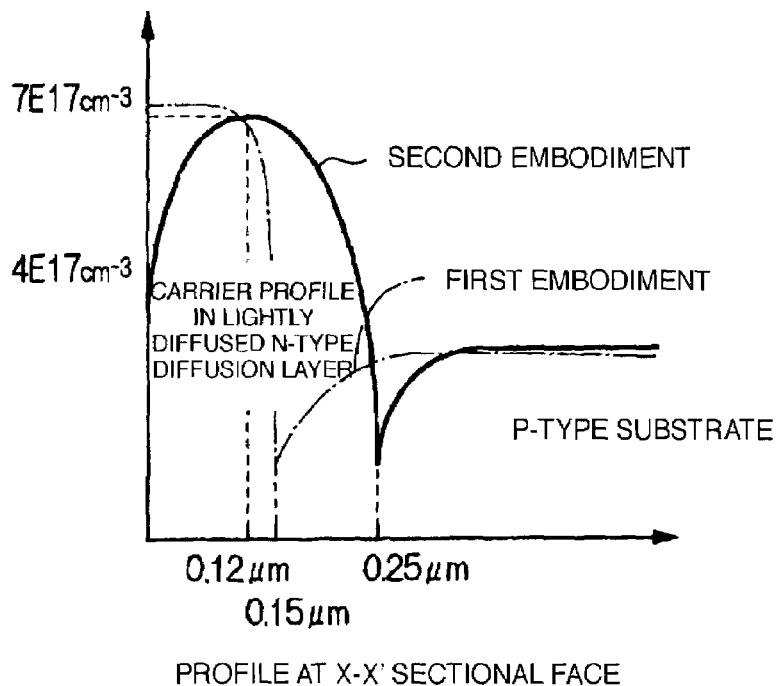
FIG. 7 is a dopant dose distribution profile at the sectional face taken on line VII—VII of FIG. 6, according to the second embodiment.
Figure 8:
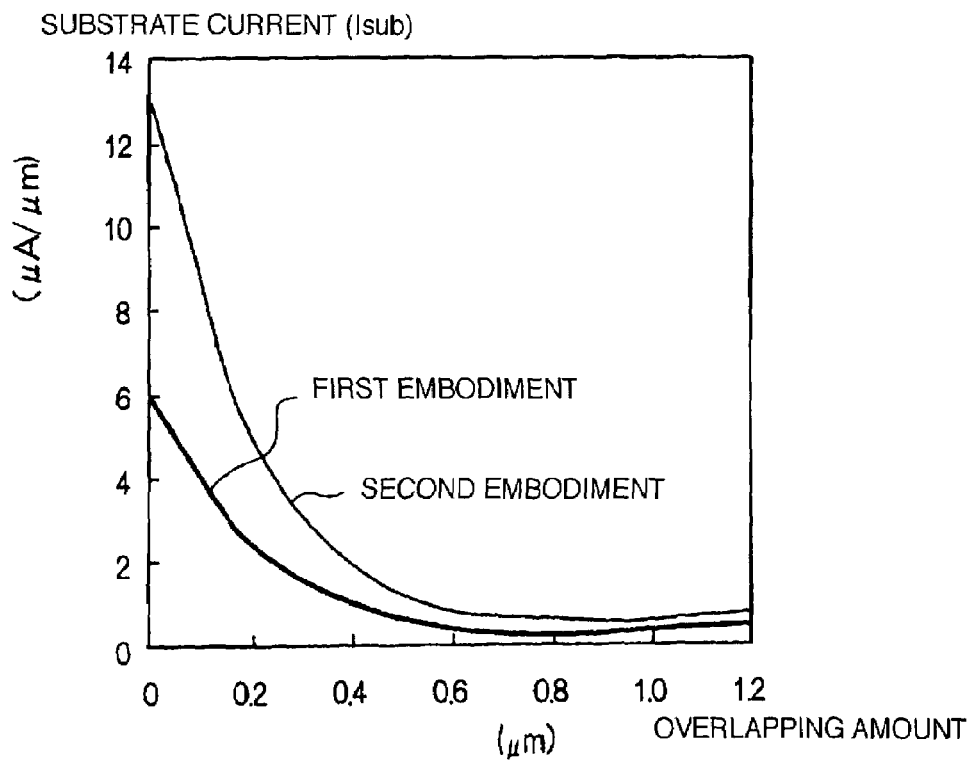
FIG. 8 is a plot of an overlapping amount of an overlapping region vs. substrate current (in comparison with that for the first embodiment) according to the second embodiment.

FIGS. 6 to 8 show a second embodiment of the invention. With reference to the second embodiment, constituent parts corresponding to those of the first embodiment are denoted by like reference numerals, omitting description of the constitution thereof.

The second embodiment is characterized in that there is provided a relative difference in dopant dose between a surface layer side of a lightly doped n-type diffusion layer 14 and an intermediate layer region thereof.

More specifically, FIG. 7 is a dose distribution profile at the sectional face taken on line VII—VII of FIG. 6, and as shown in FIG. 7, the dopant dose gradually increases from the surface layer side of the lightly doped n-type diffusion layer 14 towards a p-type silicon semiconductor substrate 12, and reaches a peak in the intermediate layer region, declining towards the back side thereof, that is, on the p-type silicon semiconductor substrate 12 side.

It is shown that the dopant dose on the surface layer side is 4 E 17 $cm^{-3}$, and the dopant dose of the intermediate layer (at a position 0.12 $\mu m$ from the surface layer face), reaching the peak, is 7 E 17 $cm^{-3}$. In forming the lightly doped n-type diffusion layer 14 described above, a highly doped region is first formed in the vicinity of the intermediate layer by implanting ions with energy at about 130 keV. Thereafter, heat treatment is applied, and a lightly diffused region is formed on the surface layer side by diffusing dopants vertically from the highly doped region formed in the vicinity of the intermediate layer. In thermal diffusion of dopants, assuming that a diffusion velocity in the vertical direction is 1, there generally occurs diffusion of dopants in the lateral direction as well at a diffusion velocity about 0.8 times as fast as that in the vertical direction.

Accordingly, in carrying out the present invention, it is desirable to set a mask size for forming the lightly doped n-type diffusion layers 14, 16, taking into consideration the expansion of diffusion layers in the lateral direction when forming the lightly diffused regions on a surface layer side.

Thus, with the second embodiment, the lightly diffused regions on the surface layer side are formed by adjusting energy for ion implantation. That is, the peak of the dopant doses is provided at depths through ion implantation with high energy, so that dopant doses on the surface side can be lowered in a relative sense.

Further, the heat treatment applied for the formation of the lightly diffused region on the surface layer side can also serve as heat treatment for forming a gate insulation film. In this case, ion implantation is preferably executed at a temperature (about 850° C. in the case of the present embodiment) for the heat treatment for forming the gate insulation film with such energy as to enable the peak of dopant doses to be formed at depths so that the lightly diffused regions can be formed towards the surface layer side.

As shown in FIG. 8, the maximum substrate current (Isub max) can be further lowered than that for the first embodiment by providing such differences in dopant dose as described above.

Now, lowering of surface dopant dose only can be implemented by adjustment of heat treatment. That is, because dopants implanted are activated when subjected to heat treatment, and by rendering the heat treatment less intense, reactivation of the dopants implanted is prevented from reaching up to the surface of the substrate, it is possible to lower the surface dopant dose.

Further, with the second embodiment, a size of thickness of the lightly doped n-type diffusion layer 14 (resultantly, that of the other lightly doped n-type diffusion layer 16, and heavily doped n-type diffusion layers 18, 20 as well) is increased as compared with that for the first embodiment, and such an increase in the thickness also contributes to reduction in strength of the substrate current.

With the embodiments of the invention, the n-channel high-voltage MOS transistor 10 of the offset gate structure is described by way of example as a high-voltage MOS transistor, however, the invention may be applied to not only the n-channel transistor but also a p-channel high-voltage MOS transistor or other type high-voltage MOS transistor such as a double diffused high-voltage MOS transistor, and so forth.

As described hereinbefore, the invention has an excellent effect in that a high-voltage MOS transistor capable of lowering the maximum substrate current without sacrificing the driving capacity of the transistor itself, and ensuring an acceptable lifetime of hot carriers can be provided.

What is claimed is:
1. A high-voltage MOS transistor comprising:
   a semiconductor substrate;
   a gate electrode disposed on the semiconductor substrate with an insulation film interposed therebetween;
   a pair of first diffusion layers formed on a surface of the semiconductor substrate and disposed apart from each other by a predetermined distance; and
   a pair of second diffusion layers, each adjacent to the respective first diffusion layers, facing away from the gate electrode, having a dopant dose higher than that of the first diffusion layers, wherein a source region is made up of one of the first diffusion layers and one of the second diffusion layers adjacent to the one of the first diffusion layers, while a drain region is made up of an other of the first diffusion layers and an other of the second diffusion layers adjacent to the other of the first diffusion layers, and one of the first diffusion layers extends from a region not under the gate electrode to a region under the gate electrode so as to be overlapped by the gate electrode by not less than approximately 0.5 $\mu$m such that a maximum substrate current per unit width in the semiconductor substrate is not larger than 5 $\mu$A/$\mu$m.

2. A high-voltage MOS transistor according to claim 1, wherein a dopant dose on a surface portion in the direction of thickness of the first diffusion layers is lower than a dopant dose in an intermediate portion in the direction of thickness of the first diffusion layers.

3. A high-voltage MOS transistor according to claim 2, wherein a distance from the surface of the semiconductor substrate to the intermediate portion is approximately 0.12 $\mu$m.

4. A high-voltage MOS transistor according to claim 1, wherein the high-voltage MOS transistor is an offset gate high-voltage MOS transistor or a double diffused high-voltage MOS transistor.

5. A high-voltage MOS transistor comprising:
   a semiconductor substrate;
   a gate electrode disposed on the semiconductor substrate with an insulation film interposed therebetween;
   a first source diffusion region formed on a surface of the semiconductor substrate;
   a first drain diffusion region having a substantial depth formed on the surface of the semiconductor substrate, extending from a region not under the gate electrode to a region under the gate electrode, and disposed apart from the first source diffusion region by a predetermined distance in a direction of a gate length of the gate electrode;
   a second source diffusion region formed away from the gate electrode farther in the direction of the gate length of the gate electrode than the first source diffusion region on the surface of the semiconductor substrate, disposed so as to be adjacent to the first source diffusion region, and having a dopant dose higher than that of the first source diffusion region; and
   a second drain diffusion region formed away from the gate electrode farther in the direction of the gate length of the gate electrode than the first drain diffusion region on the surface of the semiconductor substrate, disposed so as to be adjacent to the first drain diffusion region, and having a dopant dose higher than that of the first drain diffusion region,
   wherein the first drain diffusion region having the substantial death extends under the gate electrode and in the surface of the semiconductor substrate such that a maximum substrate current per unit width in the semiconductor substrate is not larger than 5 $\mu$A/$\mu$m.

6. A high-voltage MOS transistor according to claim 5, wherein an overlapping width of the gate electrode on the first drain diffusion region is not less than 0.5 µm, and not greater than such a distance that a depletion layer of the first source diffusion region and that of the first drain diffusion region do not come to be in contact with each other.

7. A high-voltage MOS transistor according to claim 5, wherein the high-voltage MOS transistor is an offset gate high-voltage MOS transistor or a double diffused high-voltage MOS transistor.

8. A high-voltage MOS transistor comprising:
a semiconductor substrate;
a gate electrode disposed on the semiconductor substrate with an insulation film interposed therebetween;
a first source diffusion region formed on a surface of the semiconductor substrate;
a first drain diffusion region having a substantial depth formed on the surface of the semiconductor substrate, extending from a region not under the gate electrode to a region under the gate electrode, and disposed apart from the first source diffusion region by a predetermined distance in a direction of a gate length of the gate electrode;
a second source diffusion region formed away from the gate electrode farther in the direction of the gate length of the gate electrode than the first source diffusion region on the surface of the semiconductor substrate, disposed so as to be adjacent to the first source diffusion region, and having a dopant dose higher than that of the first source diffusion region; and
a second drain diffusion region formed away from the gate electrode farther in the direction of the gate length of the gate electrode than the first drain diffusion region on the surface of the semiconductor substrate, disposed so as to be adjacent to the first drain diffusion region, and having a dopant dose higher than that of the first drain diffusion region,
wherein the first drain diffusion region having the substantial depth extends under the gate electrode and in the surface of the semiconductor substrate such that a maximum substrate current per unit width in the semiconductor substrate is not larger than 5 µA/µm, and has a dopant dose distribution in a direction of thickness of the semiconductor substrate such that a dopant dose in an intermediate portion of the first drain diffusion region in the direction of thickness is higher than a dopant dose in a surface portion of the first drain diffusion region in the direction of thickness.

9. A high-voltage MOS transistor according to claim 8, wherein an overlapping width of the gate electrode on the first drain diffusion region is not less than 0.5 µm, and not greater than such a distance that a depletion layer of the first source diffusion region and that of the first drain diffusion region do not come to be in contact with each other.

10. A high-voltage MOS transistor according to claim 8, wherein a distance from the surface of the semiconductor substrate to the intermediate portion is approximately 0.12 µm.

11. A high-voltage MOS transistor according to claim 8, wherein the high-voltage MOS transistor is an offset gate high-voltage MOS transistor or a double diffused high-voltage MOS transistor.

12. A high-voltage MOS transistor according to claim 1, wherein the first diffusion layers each have a depth of approximately 0.15 µm.

13. A high-voltage MOS transistor according to claim 5, wherein the first source diffusion region and the first drain diffusion region each have a depth of approximately 0.15 µm.

14. A high-voltage MOS transistor according to claim 8, wherein the first source diffusion region and the first drain diffusion region each have a depth of approximately 0.25 µm.

15. A high-voltage MOS transistor according to claim 3, wherein the first diffusion layers each have a depth of approximately 0.25 µm.

16. A high-voltage MOS transistor according to claim 5, wherein the first source diffusion region and the first drain diffusion region each have a depth of approximately 0.25 µm.

17. A high-voltage MOS transistor according to claim 1, wherein the first source diffusion layers include phosphorous ions, and the second diffusion layers include arsenic ions.

18. A high-voltage MOS transistor according to claim 5, wherein the first source diffusion layer and the first drain diffusion layer include phosphorous ions, and the second source diffusion layer and the second drain diffusion layer include arsenic ions.

19. A high-voltage MOS transistor according to claim 8, wherein the first source diffusion layer and the first drain diffusion layer include phosphorous ions, and the second source diffusion layer and the second drain diffusion layer include arsenic ions.

* * * * *